| United States Patent [19] | [11] Patent Number: 4,973,973 |
| Abe et al. | [45] Date of Patent: Nov. 27, 1990 |

[54] CODE CONVERTER AND ENCODER FOR CONVERTING A UNIPOLAR BINARY CODED SIGNAL INTO A BIPOLAR BINARY CODED SIGNAL

[75] Inventors: Masato Abe, Sagamihara; Fumitaka Asami, Kunitachi, both of Japan

[73] Assignee: Fujitsu Limited, Kawasaki, Japan

[21] Appl. No.: 330,528

[22] Filed: Mar. 30, 1989

[30] Foreign Application Priority Data

Apr. 4, 1988 [JP] Japan .................................. 63-82748

[51] Int. Cl.⁵ .............................................. H03M 7/00
[52] U.S. Cl. ......................................... 341/93; 341/127
[58] Field of Search ..................... 341/55, 93, 110, 127

[56] References Cited

U.S. PATENT DOCUMENTS

| 3,786,490 | 1/1974 | Hallock | 341/93 |
| 3,824,589 | 7/1974 | King | 341/93 |
| 4,005,406 | 1/1977 | Kaneko et al. | 341/110 |
| 4,087,754 | 5/1978 | Song | 341/93 |
| 4,520,347 | 5/1985 | Campbell, Jr. | 341/93 |

*Primary Examiner*—B. Roskoski
*Assistant Examiner*—Marc S. Hoff
*Attorney, Agent, or Firm*—Armstrong, Nikaido, Marmelstein, Kubovcik & Murray

[57] ABSTRACT

A code converter includes an extraction device for extracting a reference level from a binary-coded input signal, which is offset at a predetermined voltage level and which varies arbitrarily with the same polarity as the voltage level. A twos-complement conversion device, connected to the extraction device, converts the reference level into a twos-complement value. A creation device, connected to the extraction device and the twos-complement conversion device adds an output signal of the twos-complement conversion device and the binary-coded input signal, thereby producing a bipolar binary-coded output signal to which a polarity bit is added.

6 Claims, 18 Drawing Sheets

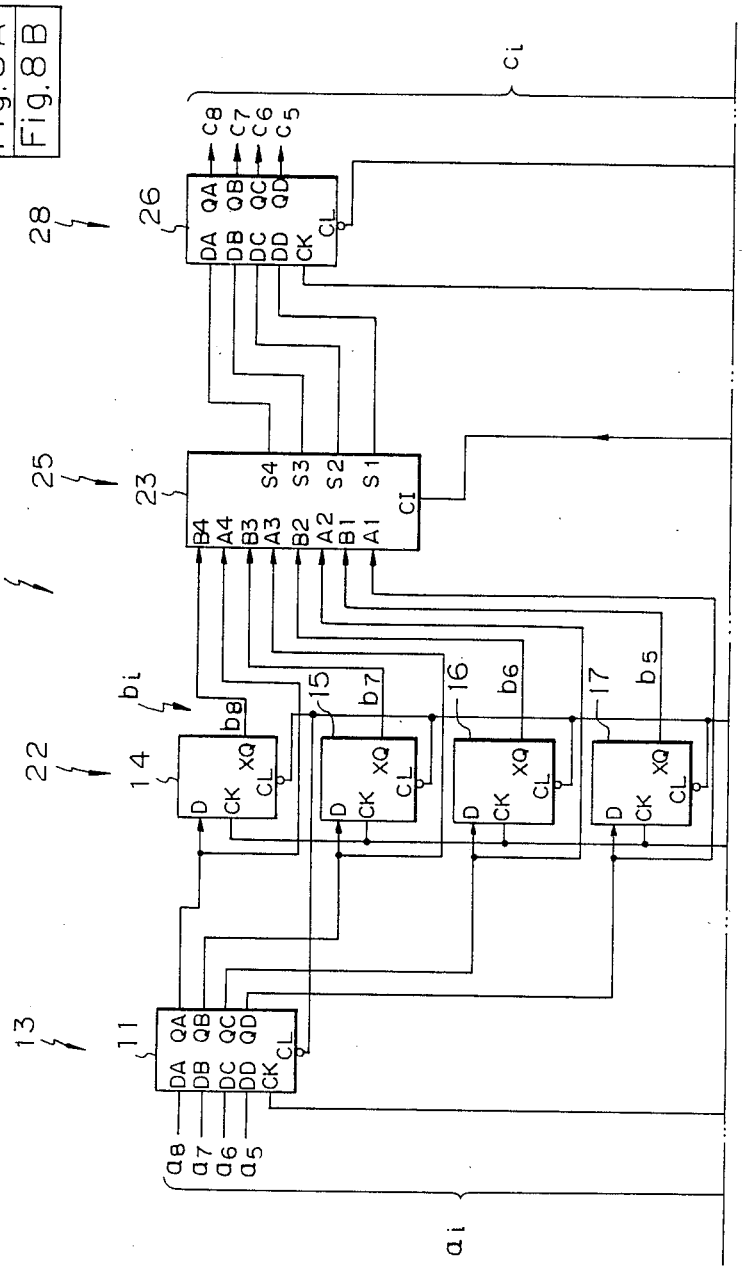

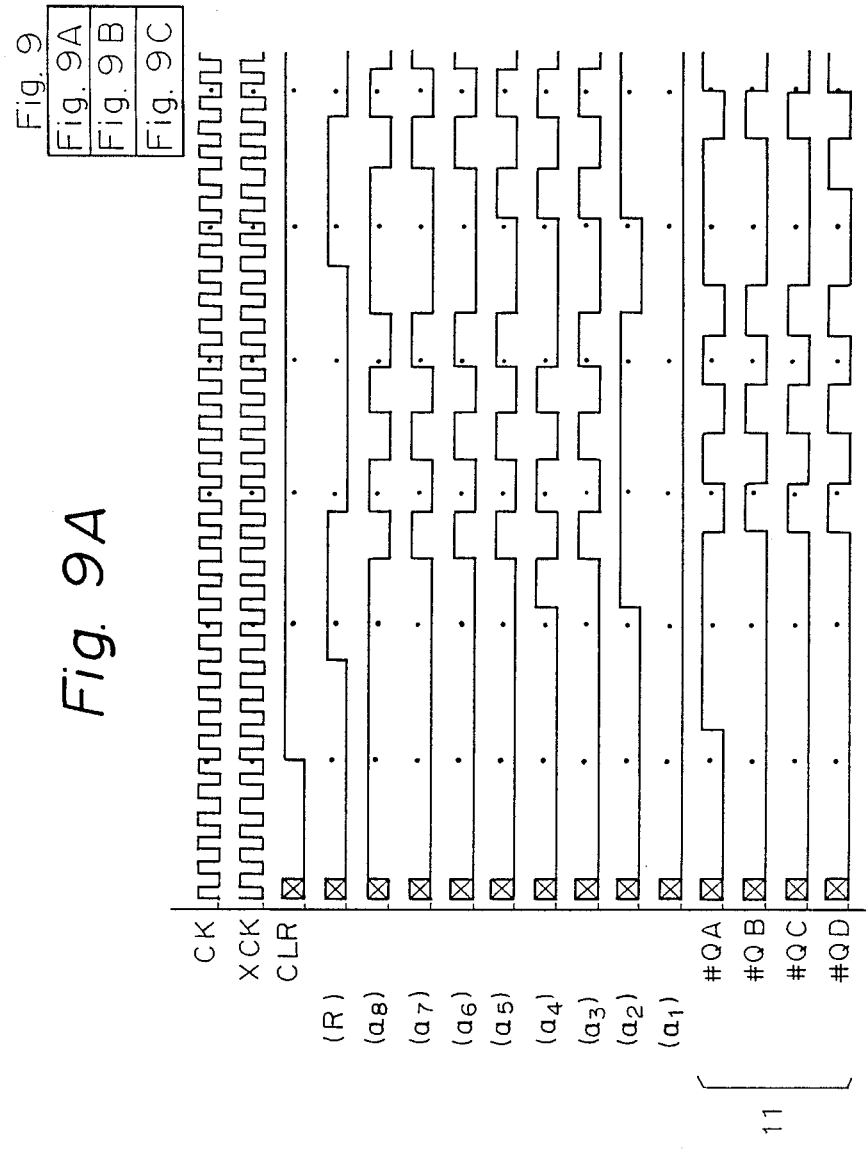

Fig. 11

| C I | A | B | S | C O |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Fig. 13

| A | | | | | C | | | |
|---|---|---|---|---|---|---|---|---|
| DECIMAL | BINARY | | | | A + B' (B' = 1000) | | | |
| $A_{10}$ | $A_2$ | | | | | | | |
| 15 | 1 | 1 | 1 | 1 | 0 | 1 | 1 | 1 |
| 14 | 1 | 1 | 1 | 0 | 0 | 1 | 1 | 0 |
| 13 | 1 | 1 | 0 | 1 | 0 | 1 | 0 | 1 |
| 12 | 1 | 1 | 0 | 0 | 0 | 1 | 0 | 0 |
| 11 | 1 | 0 | 1 | 1 | 0 | 0 | 1 | 1 |
| 10 | 1 | 0 | 1 | 0 | 0 | 0 | 1 | 0 |
| 9 | 1 | 0 | 0 | 1 | 0 | 0 | 0 | 1 |
| 8 | 1 | 0 | 0 | 0 | 0 | 0 | 0 | 0 |
| 7 | 0 | 1 | 1 | 1 | 1 | 1 | 1 | 1 |
| 6 | 0 | 1 | 1 | 0 | 1 | 1 | 1 | 0 |
| 5 | 0 | 1 | 0 | 1 | 1 | 1 | 0 | 1 |
| 4 | 0 | 1 | 0 | 0 | 1 | 1 | 0 | 0 |
| 3 | 0 | 0 | 1 | 1 | 1 | 0 | 1 | 1 |
| 2 | 0 | 0 | 1 | 0 | 1 | 0 | 1 | 0 |
| 1 | 0 | 0 | 0 | 1 | 1 | 0 | 0 | 1 |
| 0 | 0 | 0 | 0 | 0 | 1 | 0 | 0 | 0 |
| | | | | | $X_p$ | $C^2$ | $C^1$ | $C^0$ |

Fig. 14

| A | | | | | | C | | | | |
|---|---|---|---|---|---|---|---|---|---|---|
| DECIMAL | BINARY | | | | | A + B′ (B′ = 10000) | | | | |
| $A_{10}$ | $A_2$ | | | | | | | | | |
| 31 | 1 | 1 | 1 | 1 | 1 | 0 | 1 | 1 | 1 | 1 |
| 30 | 1 | 1 | 1 | 1 | 0 | 0 | 1 | 1 | 1 | 0 |
| 29 | 1 | 1 | 1 | 0 | 1 | 0 | 1 | 1 | 0 | 1 |
| . | | . | | | | | . | | | |
| . | | . | | | | | . | | | |
| . | | . | | | | | . | | | |
| 17 | 1 | 0 | 0 | 0 | 1 | 0 | 0 | 0 | 0 | 1 |
| 16 | 1 | 0 | 0 | 0 | 0 | 0 | 0 | 0 | 0 | 0 |
| 15 | 0 | 1 | 1 | 1 | 1 | 1 | 1 | 1 | 1 | 1 |
| . | | . | | | | | . | | | |
| . | | . | | | | | . | | | |
| . | | . | | | | | . | | | |
| 2 | 0 | 0 | 0 | 1 | 0 | 1 | 0 | 0 | 1 | 0 |
| 1 | 0 | 0 | 0 | 0 | 1 | 1 | 0 | 0 | 0 | 1 |
| 0 | 0 | 0 | 0 | 0 | 0 | 1 | 0 | 0 | 0 | 0 |
| | | | | | | $X_p$ | $C^3$ | $C^2$ | $C^1$ | $C^0$ |

Fig. 15

| DECIMAL | A BINARY | | | | | | | | | C A+B' (B'=10000000) | | | | | | |
|---|---|---|---|---|---|---|---|---|---|---|---|---|---|---|---|---|
| $A_{10}$ | $A_2$ | | | | | | | | | | | | | | | |
| | | | | | | | | | Xp | $C^6$ | $C^5$ | $C^4$ | $C^3$ | $C^2$ | $C^1$ | $C^0$ |
| 255 | 1 | 1 | 1 | 1 | 1 | 1 | 1 | 1 | 0 | 1 | 1 | 1 | 1 | 1 | 1 | 1 |
| 254 | 1 | 1 | 1 | 1 | 1 | 1 | 1 | 0 | 0 | 1 | 1 | 1 | 1 | 1 | 1 | 0 |
| 253 | 1 | 1 | 1 | 1 | 1 | 1 | 0 | 1 | 0 | 1 | 1 | 1 | 1 | 1 | 0 | 1 |
| . | . | . | . | . | . | . | . | . | | . | . | . | . | . | . | . |
| . | . | . | . | . | . | . | . | . | | . | . | . | . | . | . | . |
| . | . | . | . | . | . | . | . | . | | . | . | . | . | . | . | . |
| 129 | 1 | 0 | 0 | 0 | 0 | 0 | 0 | 1 | 0 | 1 | 0 | 0 | 0 | 0 | 0 | 1 |
| 128 | 1 | 0 | 0 | 0 | 0 | 0 | 0 | 0 | 0 | 1 | 0 | 0 | 0 | 0 | 0 | 0 |
| 127 | 0 | 1 | 1 | 1 | 1 | 1 | 1 | 1 | 1 | 1 | 1 | 1 | 1 | 1 | 1 | 1 |
| . | . | . | . | . | . | . | . | . | | . | . | . | . | . | . | . |
| . | . | . | . | . | . | . | . | . | | . | . | . | . | . | . | . |
| . | . | . | . | . | . | . | . | . | | . | . | . | . | . | . | . |
| 2 | 0 | 0 | 0 | 0 | 0 | 0 | 1 | 0 | 1 | 0 | 0 | 0 | 0 | 0 | 1 | 0 |
| 1 | 0 | 0 | 0 | 0 | 0 | 0 | 0 | 1 | 1 | 0 | 0 | 0 | 0 | 0 | 0 | 1 |
| 0 | 0 | 0 | 0 | 0 | 0 | 0 | 0 | 0 | 1 | 0 | 0 | 0 | 0 | 0 | 0 | 0 |

CODE CONVERTER AND ENCODER FOR CONVERTING A UNIPOLAR BINARY CODED SIGNAL INTO A BIPOLAR BINARY CODED SIGNAL

BACKGROUND OF THE INVENTION

1. Field of the Invention

The present invention relates to a code converter which is used for converting a unipolar binary coded signal into a bipolar binary coded signal, and more particularly, to a device which is intended to curtail the expansion of a circuit on a large scale, and stabilize the operation of the circuit.

2. Description of the Related Art

When digital signal processing occurs in a digital form, such as digital filtering of analog signal inputs, after a conversion from an analog signal to a digital signal has been carried out by an analog-to-digital converter, each type of digital processing is effected.

In general, a digital signal output from an analog-to-digital converter is output as a unipolar binary coded signal which represents an absolute value of an analog input signal. However, since there are many cases where a bipolar binary-coded signal having polarity information is used to effect digital signal processing as input information, a code converter is utilized in which an output of an analog-to-digital converter is converted into a bipolar binary-coded signal.

In such a prior art code converter an input signal and a reference signal are compared in order to be divided into a first half cycle and a second half cycle, and after a twos-complement conversion is carried out with respect to one half cycle, the constitution of the converter is such that the resultant signals are combined to form a bipolar binary-coded signal. As a result, the structure of a circuit such as a comparator, and an adder-subtracter, a twos-complement computing element and the like always becomes large scale in relation to the quantized accuracy of the input signals, and the problems of increased manufacturing costs still remain.

In all kinds of data acquisition apparatus formed by conventional types of code converters, such as an encoder device for producing composite picture signals in a picture processing system, the same increased cost problem occurs.

In view of these problems, the present invention has been devised.

In accordance with the present invention, a reference voltage extracted from an input signal is converted into a twos-complement value and then a bipolar binary-coded signal is produced by the addition of the above twos-complement value and the input signal.

Therefore, since it is not necessary to discriminate a half cycle of the input signal, it is unnecessary to provide a comparator. Also, since it is preferable to effect conversion processing into the twos-complement value for the reference voltage only once (it is not necessary to effect the above processing for every quantization unit), this processing is simplified. As a result, as it is intended to decrease the scale of each constituent part, a bipolar binary-coded signal can be produced at the same time.

For example, when applied to an encoder, it is obvious that the scale of the circuitry of the encoder can be reduced, so it can be realized at a lower cost.

SUMMARY OF THE INVENTION

It is an object of the present invention to provide a code converter which can convert a binary-coded signal into a bipolar binary-coded signal without leading to an increase in the scale of the circuitry.

It is another object of the invention to provide an encoder device which contains a code converter as part of its structure.

In accordance with the present invention, there is provided a code converter including: an extraction device for extracting a reference level, from a binary-coded input signal; a twos-complement conversion device, connected to the extraction device, for converting the reference level into a twos-complement value; and a creation device, connected to the extraction device and twos-complement conversion device, for adding an output signal of the twos-complement conversion device and the binary-coded input signal, thereby producing a bipolar binary-coded output signal to which a polarity bit is added.

BRIEF DESCRIPTION OF THE DRAWINGS

FIGS. 8 to 12 are diagrams showing a first embodiment of a code converter for 8 bits in accordance with the present invention;

FIG. 8 is a block diagram showing the structure of a code converter of the present invention;

FIG. 9 is a timing diagram showing the timing characteristics of principal portions of FIG. 8;

FIG. 10 is a connection diagram showing a structure of an operation circuit in FIG. 8;

FIG. 11 is a truth table common to each of $FA_0$ to $FA_{n-1}$ of the operation circuit 25 in FIG. 8;

FIG. 12 is a waveform showing behavoirs between an input signal $a_i$, a bipolar binary coded signal $C_i$ and a leading edge timing of R';

FIG. 13 is a diagram showing a bipolar binary-coded signal when the reference level $B_{10}=8$ for 4-bit data (A);

FIG. 14 is a diagram showing a bipolar binary-coded signal when the reference level $B_{10}=16$, for 5-bit data (A);

FIG. 15 is a diagram showing a bipolar binary-coded signal when the reference level is $B_{10}=128$, for 8-bit data (A);

DESCRIPTION OF THE PREFERRED EMBODIMENTS

Before describing the preferred embodiments, a prior art code converter will be described with reference to FIGS. 1 to 4.

FIGS. 1 to 4 are diagrams showing an example of a prior art code converter.

Figure 1:
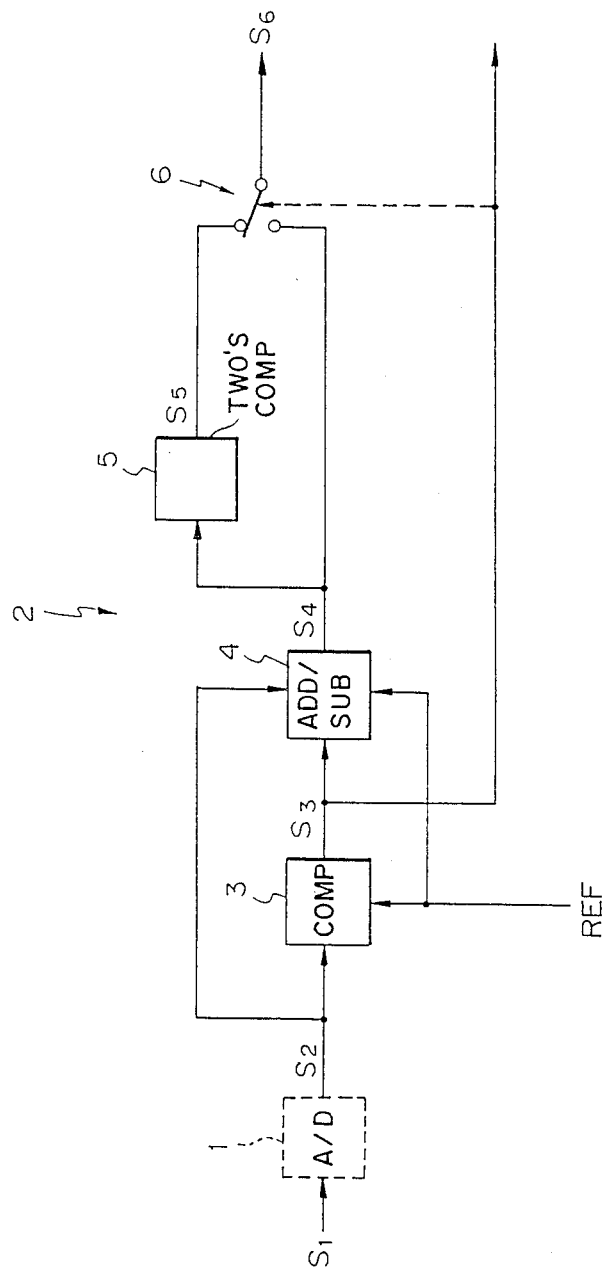
FIG. 1 is a block diagram showing an example of a prior art code converter.
Figure 2:
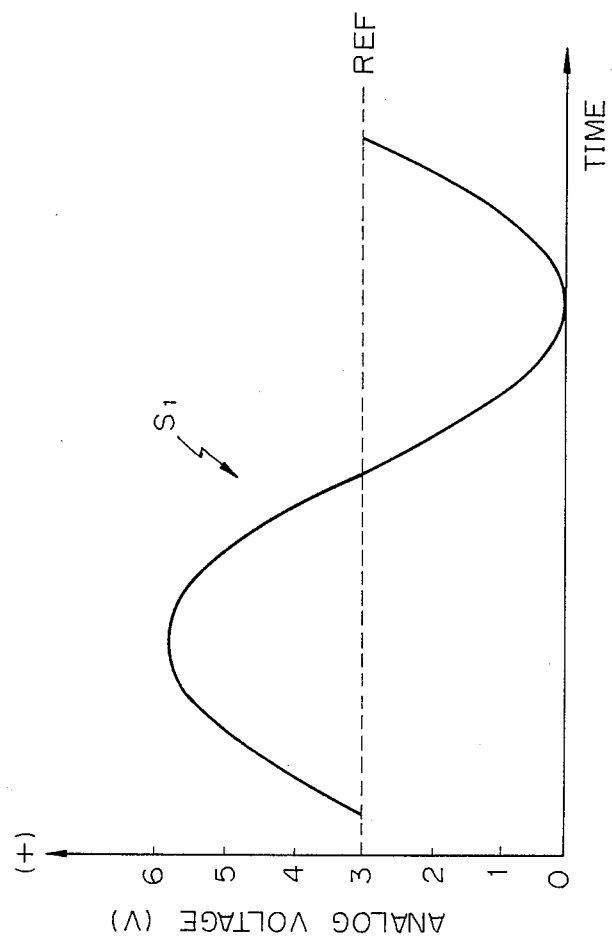
FIG. 2 is a waveform of an input signal S1 in FIG. 1 which +3 V forms the boundary.
Figure 3:
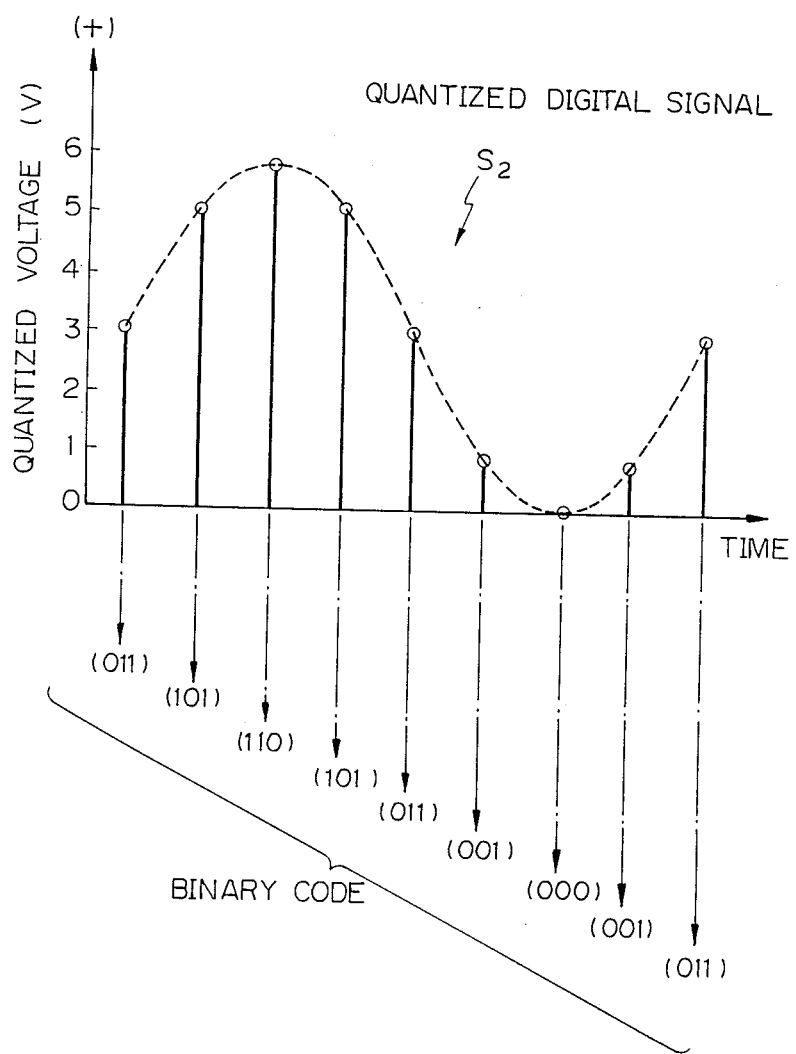
FIG. 3 is a waveforms of a quantized digital signal S2 and a corresponding binary codes.

In FIG. 1, reference numeral 1 denotes an analog-to-digital converter which receives a unipolar analog value of an input signal S1. This input signal S1 is shown in FIG. 2, where the plus 3 V forms the boundary between a first half cycle, i.e., from +3 V to +6 V, and a second half cycle, i.e., from +3 V to 0 V. This +3 V is a reference voltage. The input signal S1 is quantized by a predetermined quantization unit to convert the quantized input signal into a digital signal S2 as shown in FIG. 3.

A code converter 2 includes a comparator 3, an adder subtracter 4, a twos-complement calculator 5 and a selector 6 and outputs a digital signal S6 which is made bipolar-binary-coded. The comparator 3 compares a reference voltage REF equivalent to the above-noted +3 V with a digital signal S2 and then discriminates a first half cycle and a second half cycle. The adder subtracter 4 subtracts a reference voltage REF from the first half cycle S2 and adds a reference voltage REF to the second half cycle S2 to produce a unipolar digital signal S4. The twos-complement calculator 5 produces a complement signal S5 which twos-complement-converts the second half cycle of the digital signal S4. In response to the output of the comparator 3, the selector 6 selects a unipolar digital signal S4 for the first half cycle and selects a complement signal S5 for the second half cycle. In the specification, the term two's complement of complement on two is represented by "twos complement".

Figure 4:
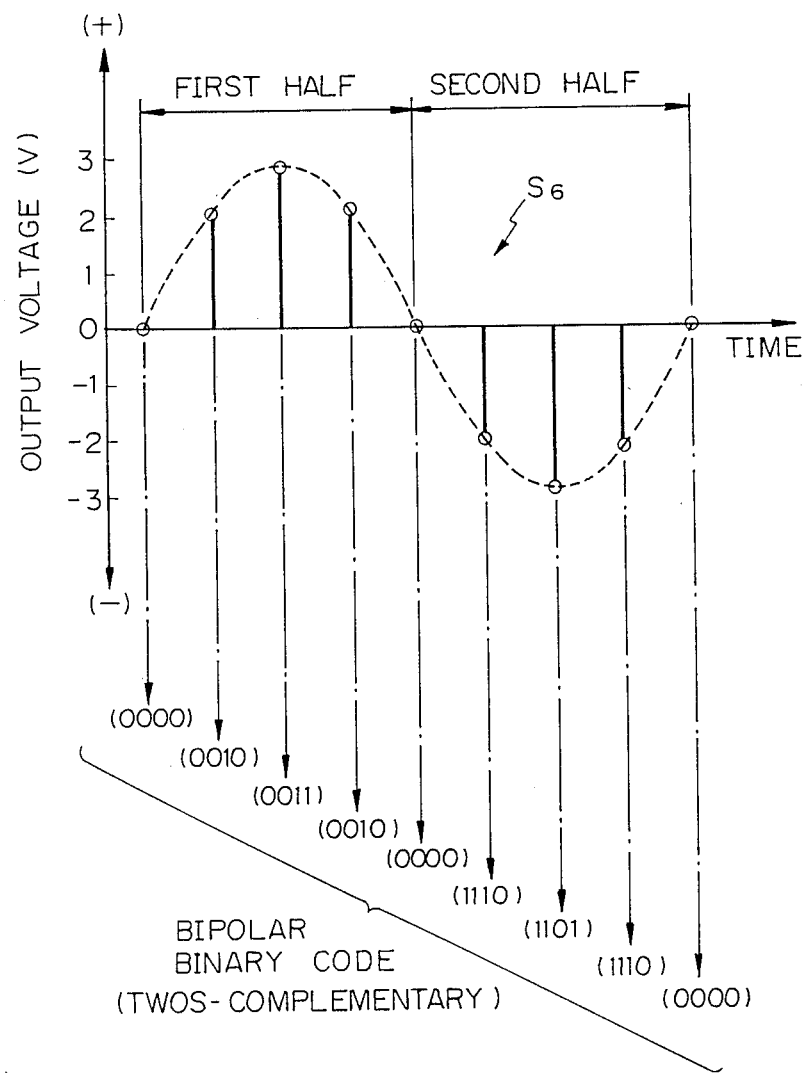
FIG. 4 is a waveform of a digital signal S6 output from a selector in FIG. 1, having a first and a second half cycles and corresponding bipolar binary codes.

In FIG. 4, the value of the output voltage at the first half cycle corresponds to the value obtained by subtracting a reference voltage REF (equal to 3 V of a digital signal S2) from an output S2 of A/D converter 1, whereas that at the second half cycle corresponds to the value obtained when a reference voltage REF is added to the output S2 of an A/D converter 1, from the value which is twos-complement-converted.

Therefore, a bipolar binary-coded digital signal is output from the code converter 2. When the bipolar binary-coded digital signal is applied to the input information from various kinds of digital signal processing, a desirable result is attained.

Figure 5:
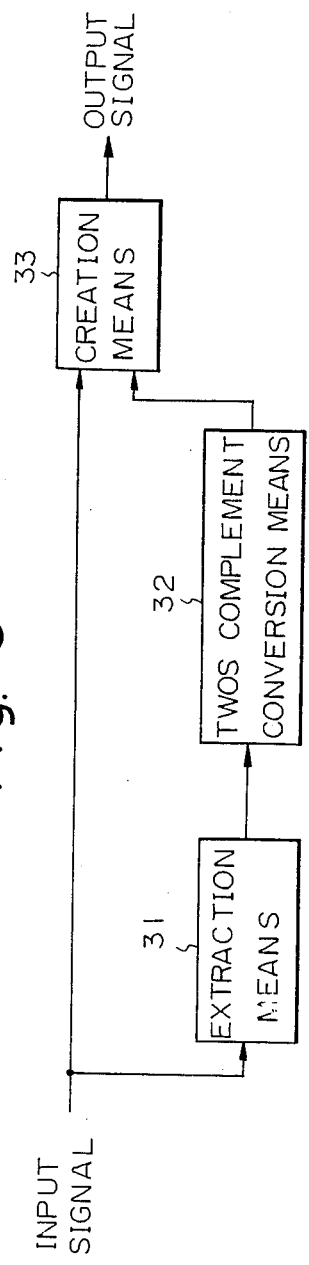
FIG. 5 is a block diagram showing a principle of a code converter in accordance with present invention.

FIG. 5 is a block diagram showing a principle of a code converter in accordance with the present invention.

In FIG. 5, the code converter of the present invention includes an extraction means 31, a twos-complement conversion means 32, and a creation means 33. The extraction means 31 is set to a predetermined voltage level for an offset voltage and the voltage level is extracted, as a reference voltage REF to be held, from an input signal which is binary-coded to be able to arbitrarily change a polarity of the voltage level. The twos-complement conversion means 32 converts the extracted reference voltage into a twos-complement value. The output signal of the twos-complement conversion means 32 and the above-noted binary-coded input signal are added to correct the offset voltage and the creation means 33 produces a bipolar binary-coded output signal to which a polarity bit is added.

Figure 6:
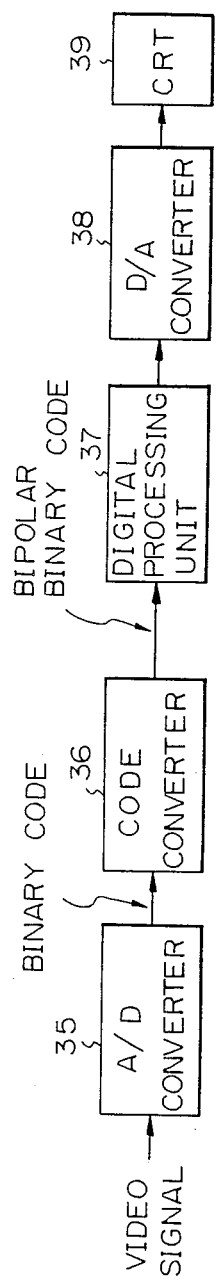
FIG. 6 is a block diagram showing an encoder in accordance with the present invention.

FIG. 6 is a block diagram showing an encoder in accordance with the present invention.

In FIG. 6, a video signal is input to an analog-to-digital converter 35 to produce a binary-coded signal. The binary-coded signal is input to a code converter 36, which outputs a bipolar binary-coded signal and the output of the code converter 36 is sent to a digital processing unit 37 to digitally process the input signal. The output of the digital processing unit 37 is input to a digital-to-analog converter 38 and then sent to a display unit 39 such as a cathode ray tube.

As described above, the encoder device has a conversion circuit which converts a binary-coded signal, such as at least a color difference signal and a luminance signal into a respective bipolar binary-coded signal. The encoder device synthesizes each converted signal to produce a composite picture signal. Thus, the conversion circuit includes the above-noted code converter, which does not use a comparator. Since the conversion circuit used the code converter, processing the conversion into a twos-complement is needed only once. As a result, the processing is simplified and the scale of each component is remarkably diminished and the scale of the circuitry in the encoder device is accordingly reduced.

Figure 7:
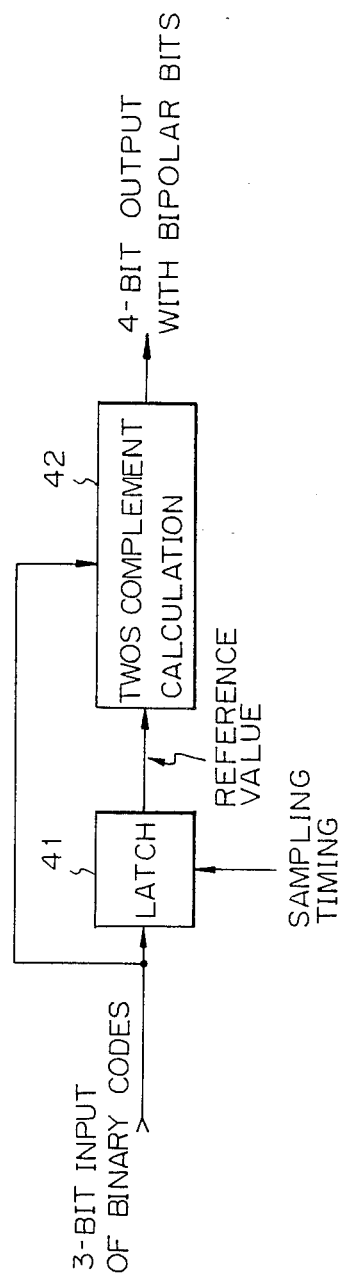
FIG. 7 is a conceptional diagram showing the operation of a code converter in accordance with the present invention.

FIG. 7 is a functional diagram showing the operation of a code converter in accordance with the present invention.

In FIG. 7, a three-bit binary code is input into a latch 41 which receives a sampling timing signal, to produce a reference value. The reference value signal and the three-bit binary code are input to a twos-complement calculation unit 42 to produce a four-bit output with bipolar bits.

FIGS. 8 to 12 are diagrams showing a first embodiment of a code converter in accordance with the present invention applied to a code conversion of eight-bit data. The number of bits is, of course, not limited to eight.

Figure 8B:
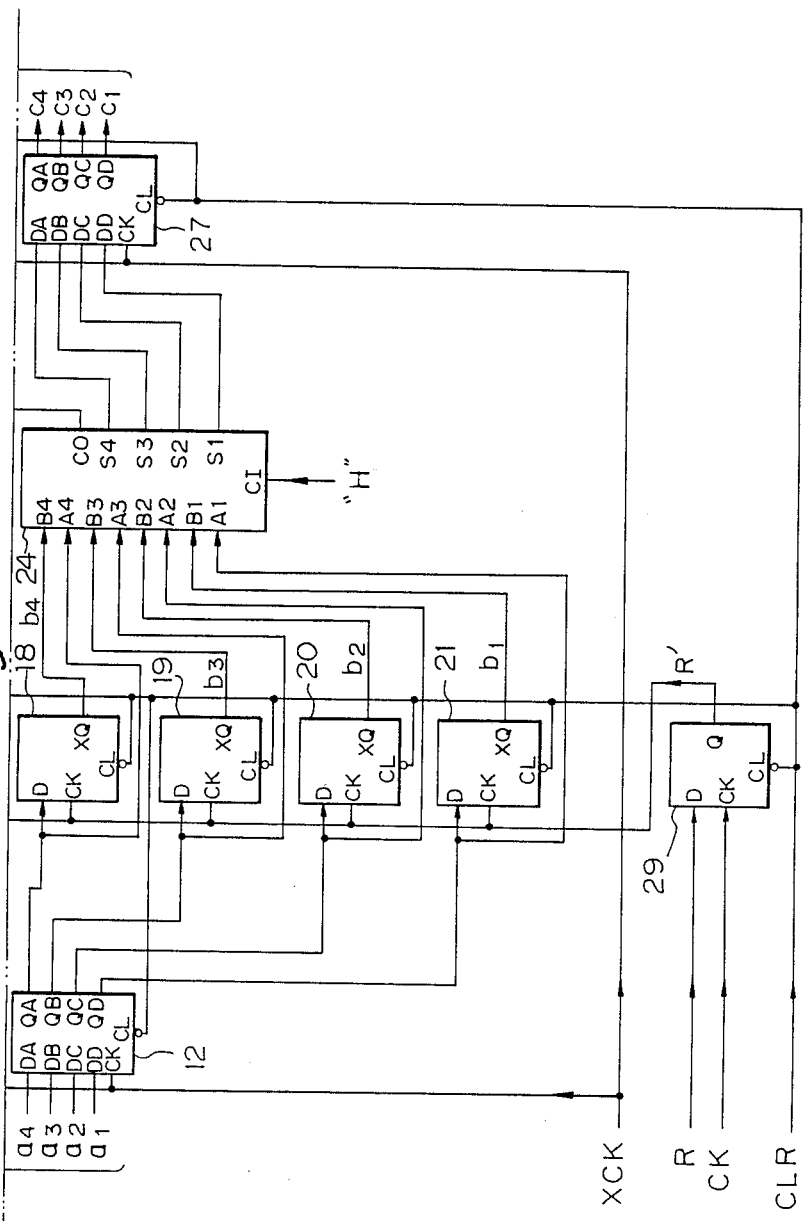

In FIG. 8 explaining the structure of a code converter, the code converter 10 includes an input buffer 13, a latch circuit (extraction means) 22, a calculation circuit 25, an output buffer 28, and a timing circuit 29. The input buffer 13 includes two 4-bit flip-flops 11 and 12, the latch circuit 22 includes eight flip-flops 14 to 21, and the calculation circuit 25 includes two 4-bit calculation units 23 and 24. The output buffer 28 includes two 4-bit flip-flops 26 and 27, and the timing circuit 29 synchronizes an extraction timing signal R which is input from outside by means of a clock signal CK to produce a synchronization extraction timing signal R'.

In FIG. 8, $a_i$ denotes each binary-coded input signal from an external analog-to-digital converter (where $i=1$ to 8), $b_i$ a reference level signal showing a reference voltage, $c_i$ an output signal which is bipolar-binary-coded, XCK a quantized timing signal from outside which is synchronized with a quantized frequency of an input signal $a_i$, and a an external clear signal CLR.

Figure 9B:
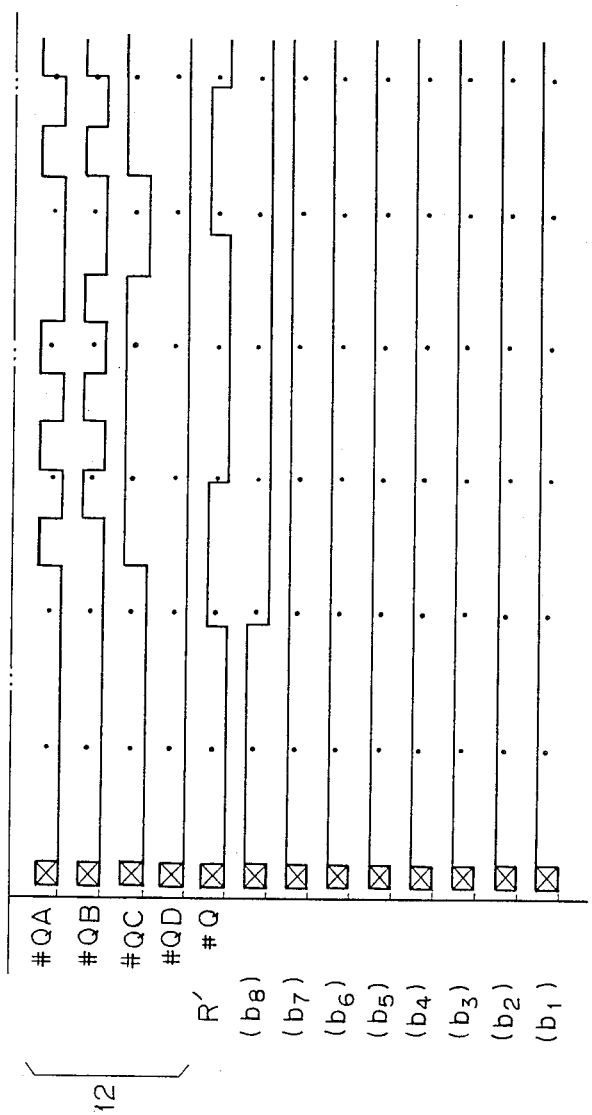
Figure 9C:
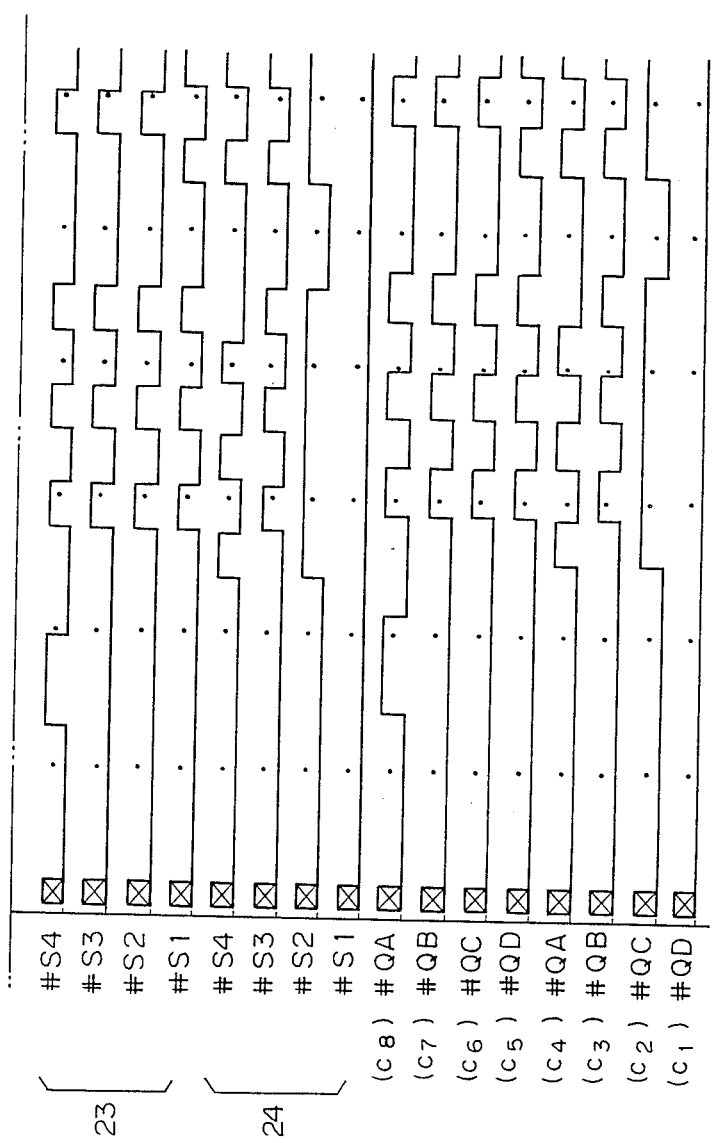

FIG. 9 is a timing chart of the circuit in FIG. 8. The output of a selector 6 (FIG. 1), flip-flops 11, 12 and calculation unit 23, 24 are shown together with the signals $a_i$, $b_i$ and $c_i$.

Figure 10:
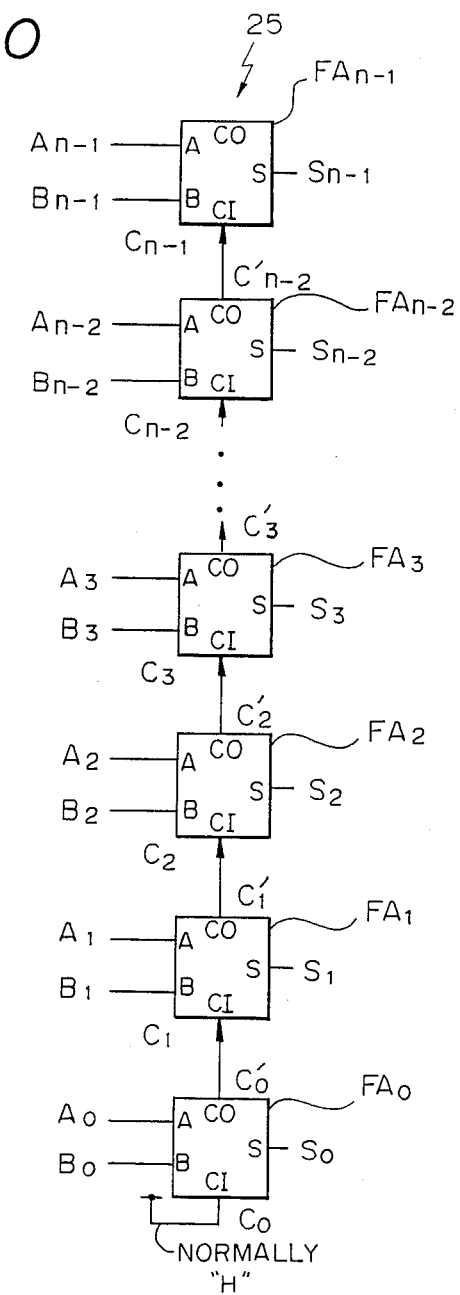

FIG. 10 is a connection diagram showing a structure of an calculation circuit 25 which is formed by the above-noted two 4-bit calculation units 23 and 24. In FIG. 10, the calculation circuit 25 is formed by 1-bit full adders $FA_0$ to $FA_{n-1}$ by a bit number of $a_i$. Signals $A_0$ to $A_{n-1}$ (that is, $a_i$ signals passed through an input buffer 13) are input into each A input of $FA_0$ to $FA_{n-1}$, (that is, $a_i$ signals passed through an input buffer 13), and signals $B_0$ to $B_{n-1}$ (that is, $b_i$ signals from a latch circuit 22) are input into each B terminal. To a CI terminal of $FA_0$ an "H level" potential (for example, a power source voltage) is normally input as a signal $C_0$. An output logic $C_0'$ according to a truth table described later, is obtained from a $C_0$ terminal of $FA_0$ and the output logic signal $C_0'$ is input into a CI terminal of the next highest adder, i.e., $FA_1$, as a signal $C_1$. In the same manner each $C_0$ terminal from $FA_1$ to $FA_{n-1}$ is connected in series to each CI terminal of the next highest adder. The $A_0$ and $B_0$ terminals in FIG. 10 correspond to $A_1$ and $B_1$ of the 4-bit calculation unit 24 in FIG. 8, and $A_{n-1}$ and $B_{n-1}$ correspond to $A_4$ and $B_4$ of the 4-bit calculation unit 23.

FIG. 11 is a truth table common to each adder $FA_0$ to $FA_{n-1}$ forming the calculation circuit 25 in FIG. 8.

The operation circuit 25 effects an operational processing of each $b_i$ output from the latch circuit 22 (that is, the potential at which $a_i$ is latched by a timing of R' to be held therein and is inverted and output from each XQ terminal) according to the truth table as shown in FIG. 11. The calculation circuit 25 effects a first operational processing for converting $b_i$ as a reference voltage into a twos-complement value and a second operational processing for adding the operated twos-complement (a twos-complement concerning $b_i$) and $a_i$ value input to each B terminal to zero-correct the reference voltage (i.e., corresponding to the offset value of $a_i$). The resultant value of such operational processings is output as the bipolar binary-coded output signal, from terminals $S_1$ to $S_4$ of the 4-bit operation unit 24 and terminals $S_1$ to $S_4$ of the 4-bit operation unit 23. Therefore, the calculation circuit 25 together with the latch circuit 22 functions as a twos-complement conversion means and a creation means.

Figure 12:
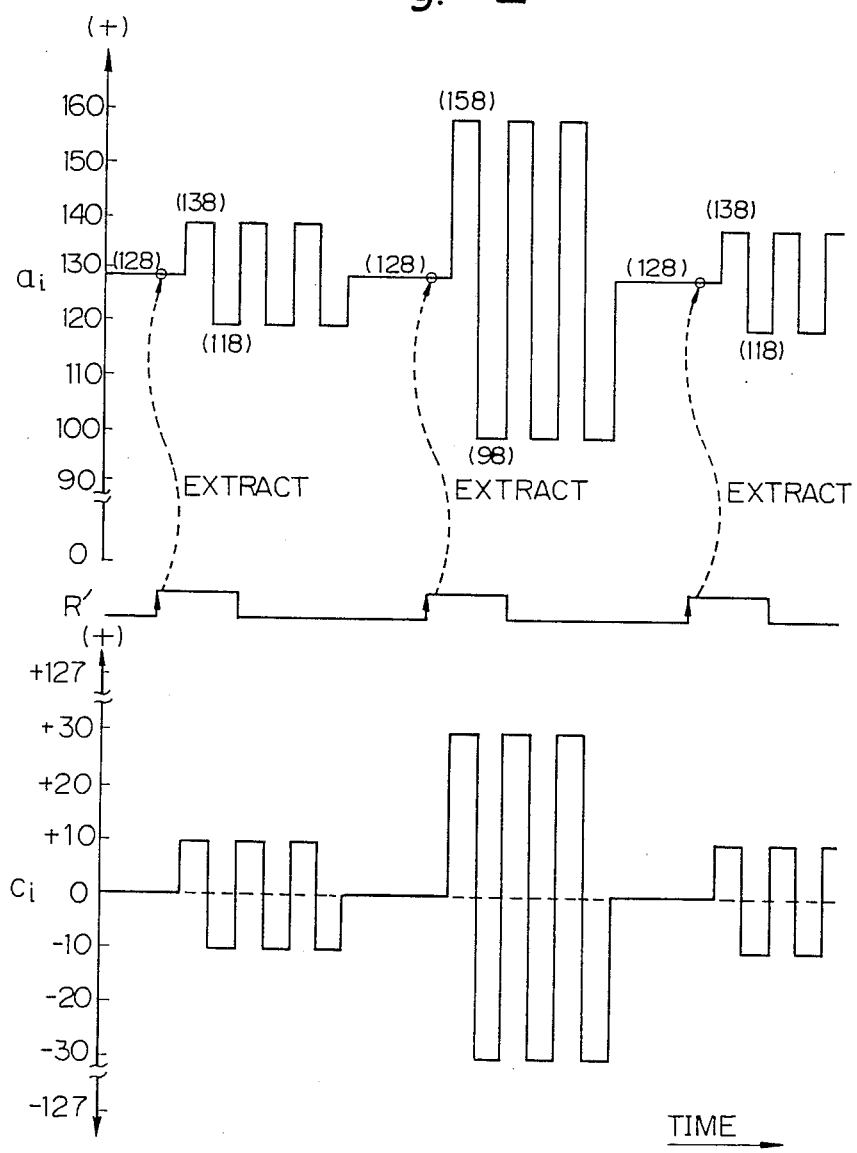

In such a structure, when the $a_i$ signal from an analog-to-digital converter is input as a variation of potential as shown in FIG. 12, that is, when the $a_i$ signal varies alternatively as an offset value of a predetermined potential level, for example, (+128), since the offset value coincides with a build-up timing of R', the offset value is loaded into each flip-flop 14 to 21 of the latch circuit 22 using this timing. To explain more exactly, the $a_i$ signal which is loaded into the input buffer 13 in accordance with a quantized timing signal XCK, is added to each D input of each flip-flop 14 to 21 in the latch circuit 22. Each flip-flop 14 to 21 loads the D input (i.e., $a_i$) inside by a build-up timing of R' from the timing circuit 29 to hold it until a leading state of a next R' and at the same time outputs it from the XQ terminal as the $b_i$ value corresponding to the reference voltage. That is to say, the latch circuit 22 is offset at a predetermined voltage level (in this case (+128)) and extracts the voltage level (+128) as the value ($b_i$) corresponding to the reference voltage from the binary-coded input signal ($a_i$) which varies arbitrarily (in this case, varies alternatively) with the same polarity as the voltage level (in this case, + side) and holds the value.

On the other hand, the $a_i$ value loaded into the input buffer 13 is also applied to the A input of the calculation circuit 25. The $b_i$ signal from the latch circuit 22 is input to the B input of the calculation circuit 25 and the calculation circuit 25 performs a twos-complement of $2'b_i$ of this $b_i$, adds the $a_i$ value applied to the A input and the $2'b_i$ value and then outputs it through the output buffer 28 as a bipolar binary-coded signal $C_i$ which makes $C_8$ a polarity bit (Xp which will be explained later).

The above-described operation of the twos-complement of the $b_i$ and the reason why this twos-complement ($2'b_i$) and the $a_i$ are added, will be described next.

In general, a positive integer X from 0 to $2^{n-1}$ is expressed by the following equation (1) in accordance with a natural binary code $\{x_1, x_2, x_3 \ldots x_n\}$ of n bits:

$$X = \sum_{i=1}^{n} x_i 2^{i-1} \tag{1}$$

Now, suppose that natural binary codes A and B of L bits are, respectively,

A: $\{a_1, a_2, a_3 \ldots a_L\}$

B: $\{b_1, b_2, b_3 \ldots b_L\}$,

A and B are expressed as follows:

$$A = \sum_{i=1}^{L} a_i 2^{i-1} \tag{2}$$

$$B = \sum_{i=1}^{L} b_i 2^{i-1} \tag{3}$$

With regard to A and B, suppose that B is a dynamic value (not a fixed value) and when the operation (A−B) is carried out, it can be effected in the following manner. That is, when a negation of B is expressed by the expression $$\overline{B}: \{\overline{b}_1, \overline{b}_2, \overline{b}_3 \ldots \overline{b}_L\}, \tag{4}$$

a twos-complement B' on B becomes $$\{\overline{b}_1, \overline{b}_2, \overline{b}_3 \ldots \overline{b}_L\}$$
$$+ \quad 1, \; 0, \; 0, \ldots 0$$
_____
$$B'; \quad \{b_1', b_2', b_3' \ldots b_L'\}.$$

Since generally $(A - B = A + B')$, $$A: \quad \{a_1, a_2, a_3 \ldots a_L\}$$
$$+ \quad B': \quad \{b_1', b_2', b_3', \ldots b_L'\}$$
_____
$$C(2): \quad \{c_1, c_2, c_3 \ldots C_{L-1}, Xp\}$$

where C(2): binary
Xp: a polarity bit
$Xp = 0$ ($A \geqq B$)
$Xp = 1$ ($A < B$)

Therefore, $(C = A - B)$ is $$C(10) = \sum_{i=1}^{L-1} C_i 2^{i-1} - Xp \, 2^L$$

where C(10): decimal

The answer C(10) of the operation (A−B) is obtained as a bipolar binary code of a twos-complement representation which makes Xp a polarity bit.

The following shows three examples of C required when the bit number of A and the value of B vary, respectively.

FIG. 13 shows an example when the reference level (B) is $B_{10} = 8$ for 4-bit data (A).

FIG. 14 shows an example when the reference level (B) is $B_{16} = 16$, for 5-bit data (A).

FIG. 15 shows an example when the reference level (B) is $B_{10}=128$, for 8-bit data (A), which corresponds to the embodiment of the present invention.

As shown in FIG. 15 concerning an embodiment of the present invention, the value of Ci for $a_i=(128)$ becomes {00000000} and when the value $a_i$ takes another voltage, for example, $a_i=(253)$, the value of $C_i$ becomes {01111101}. When the value $a_i$ takes still another voltage, for example, $a_i=(2)$, the value of $C_i$ becomes {10000010}. In this way, the value of $C_i$ (which is bipolar binary-coded) with respect to $C_0$ to $C_7$, (when $C_7$ is $X_p$) which makes $X_p$ a polar bit, can be obtained.

Therefore, the prior art is improved on and since a conventional twos-complement operational processing of every quantized unit of input signals is not necessary and a comparator for discriminating the polarity is also unnecessary, a simplified code converter can be attained.

As a result, and as the reduction of cost is realized, a code converter can be realized which can simply convert a binary-coded signal into a bipolar binary-coded signal.

Figure 16:
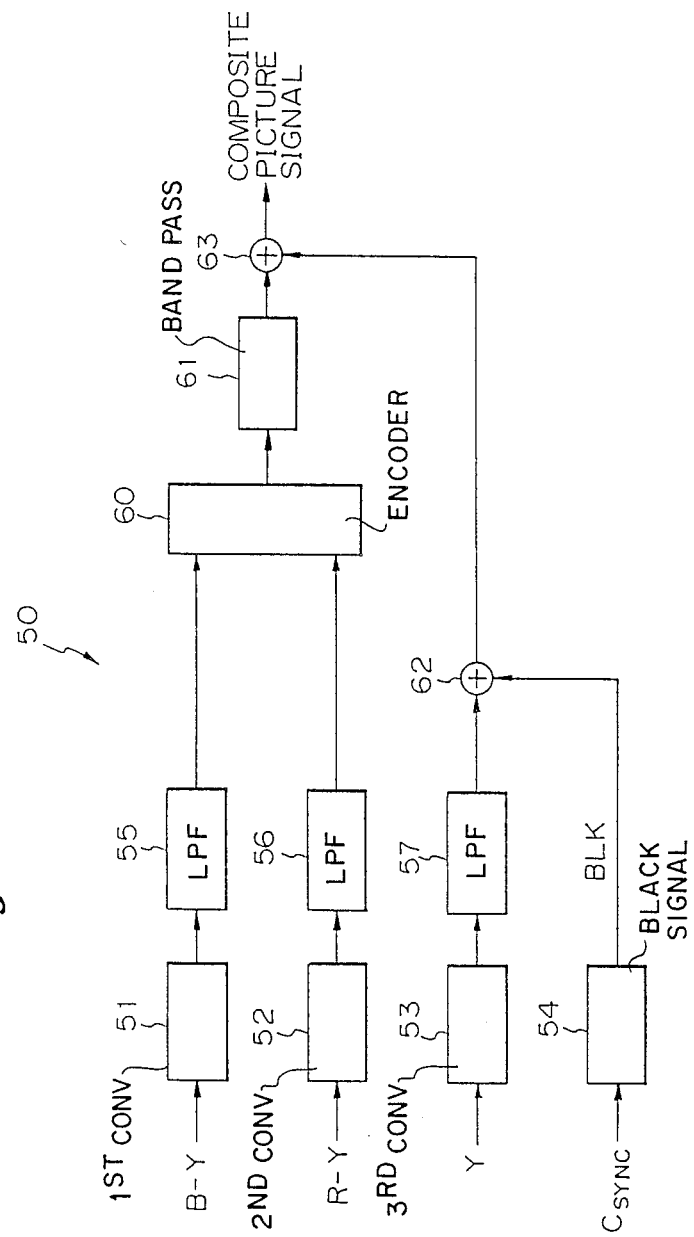
FIG. 16 is a block diagram showing a second embodiment of a code converter in accordance with the present invention when applied to a picture signal encoder device.

FIG. 16 a block diagram showing a second embodiment of a code converter in accordance with the present invention and an example is shown in which a first embodiment of the code converter is applied to a composite picture signal encoder device (especially for the NTSC system) in a digital picture processing system.

In FIG. 16, reference numeral 50 denotes an encoder device. The encoder device 50 includes a first, second and third conversion circuits 51, 52 and 53, a black signal generation circuit 54, digital low-pass filters 55 to 57, a encoder circuit 60, a digital band pass filter 61, a Y-BLK addition circuit 62, and a chrominance signal addition circuit 63.

The first and second conversion circuits 51 and 52 convert binary-coded color difference (Blue-Yellow) and (Red-Yellow) signals into a respective bipolar binary-coded signal and the conversion circuits 51 and 52 include the code converter 10 of the first embodiment. The third conversion circuit converts a binary-coded luminance signal Y into a bipolar binary-coded signal and includes the code conversion circuit 10. The third conversion circuit 53 includes a level conversion circuit. The black signal generation circuit 54 produces a black signal BLK in accordance with a composite synchronization signal $C_{SYNC}$. Digital low-pass filters 55, 56 and 57 have a respective predetermined low-pass characteristic in correspondence with the frequencies of signals being passed. The encoder circuit 60 synthesizes two signals (that is, a (B-Y) signal and a (R-Y) signal) to produce a chrominance signal. The digital band pass filter 61 passes a specified frequency and has a predetermined pass characteristic in response to frequency components of a chrominance signal. The Y-BLK addition circuit 62 effects a digital addition of both a bipolar binary-coded Y signal passed through the digital low-pass filter 57 and a BLK signal. The composite picture signal addition circuit 63 digitally adds the result of the addition in the Y-BLK addition circuit 62 and a chrominance signal passed through the digital band pass filter 61 to produce a composite picture signal.

In general, in a color picture processing system according to an NTSC (National Television System Committee) system, the picture information is transmitted by a composite picture signal which synthesizes both color difference composite signals (B-Y) and (R-Y) and a luminance signal Y and the composite picture signal is produced by processing or the original pictures R, G and B output from a television camera. In conventional picture processing, an analog processing is generally used, but it is desired that a transition to digital picture processing be adopted from the point of view of stability of the circuit operation.

As for an encoder device effecting these kinds of digital processing, the code converter 2 in FIG. 1 in place of the conversion circuits 51 to 53 in FIG. 16 has been conventionally used, but it is not desirable in terms of cost due to the increase in scale of the circuitry.

On the contrary, according to the structure of an embodiment of the present invention, in comparison with the prior art (that is, the code converter 2 in FIG. 1), since the encoder device is formed by the first to third conversion circuits 51 to 53 including a small-scale code converter 10 (as described in the first embodiment), an encoder device can be realized which has high stability and low cost.

We claim:

1. A code converter comprising:
   extraction means for determining a reference level from a binary-coded input signal, said binary-coded input signal being offset at a predetermined voltage level and said binary-coded input signal varying arbitrarily with the same polarity as said predetermined voltage level, said extraction means determining said predetermined voltage level as said reference level;
   twos-complement conversion means, connected to said extraction means, for converting said reference level into a twos-complement value; and
   creation means, connected to said extraction means and twos-complement conversion means for adding an output signal of said twos-complement conversion means and the binary-coded input signal, therein producing a bipolar binary-coded output signal to which a polarity bit is added.

2. A code converter according to claim 1, wherein said extraction means comprises:
   an input buffer for receiving the binary-coded input signal; and
   a latch circuit for holding the reference voltage in response to a timing signal.

3. A code converter according to claim 1, wherein said extraction means comprises:
   an input buffer for receiving the binary-coded input signal; and
   a timing circuit for synchronizing an extraction timing signal input from outside by means of a clock signal to produce a synchronization extraction timing signal.

4. A code converter according to claim 2, wherein when the binary-coded input signal varies alternatively as an offset value of a predetermined potential level, since the offset value coincides with a leading timing, the offset value is loaded into said latch circuit.

5. A code converter according to claim 1, wherein said code converter includes an operation circuit and said operation circuit effects an operational processing of a reference level signal output from a latch circuit, a first operational processing for converting said reference level signal as a reference voltage into a twos-complement and a second operational processing for adding the operated twos-complement of the reference level signal and a binary-coded input signal from an A/D converter to zero-correct said reference voltage corresponding to said offset value of the binary-coded input signal, are carried out.

6. An encoder device comprising:
a conversion circuit for converting at least a color difference signal and a luminance signal into a respective bipolar binary-coded signal and synthesizing each of said converted signals to produce a composite picture signal, wherein said conversion circuit includes a code converter including extraction means for determining a reference level from a binary-coded input signal, said binary-coded input signal being offset at a predetermined voltage level and said binary-coded input signal varying arbitrarily with the same polarity as said predetermined voltage level, said extraction means determining said predetermined voltage level as said reference level;

twos-complement conversion means, connected to said extraction means, for converting said reference level into a twos-complement value; and creation means, connected to said extraction means and twos-complement conversion means for adding an output signal of said twos-complement conversion means and the binary-coded input signal, therein producing a bipolar binary-coded output signal to which a polarity bit is added.

* * * * *